United States Patent
Li et al.

(10) Patent No.: US 7,616,031 B2
(45) Date of Patent: Nov. 10, 2009

(54) HARD RESET AND MANUAL RESET CIRCUIT ASSEMBLY

(75) Inventors: Chieh-Jung Li, Kaohsiung (TW); Po-Chun Huang, Tainan County (TW)

(73) Assignee: Universal Scientific Industrial Co., Ltd., Nan Tou (TW)

( * ) Notice: Subject to any disclaimer, the term of this patent is extended or adjusted under 35 U.S.C. 154(b) by 0 days.

(21) Appl. No.: 12/003,879

(22) Filed: Jan. 3, 2008

(65) Prior Publication Data

US 2009/0174443 A1   Jul. 9, 2009

(51) Int. Cl.
*H03L 7/00* (2006.01)
(52) U.S. Cl. .................... 327/142; 327/198
(58) Field of Classification Search ............ 327/142, 327/143, 198
See application file for complete search history.

(56) References Cited

U.S. PATENT DOCUMENTS

| | | | | |
|---|---|---|---|---|
| 3,585,409 A | * | 6/1971 | Kato et al. | 327/228 |
| 4,254,347 A | * | 3/1981 | Ray | 327/143 |
| 4,268,763 A | * | 5/1981 | Johnson | 327/143 |
| 5,313,112 A | * | 5/1994 | Macks | 327/143 |
| 5,760,625 A | * | 6/1998 | Macks | 327/198 |
| 5,935,254 A | | 8/1999 | Lee | |

* cited by examiner

*Primary Examiner*—Lincoln Donovan
*Assistant Examiner*—William Hernandez
(74) *Attorney, Agent, or Firm*—Bacon & Thomas, PLLC

(57) ABSTRACT

A simple inexpensive hard reset and manual reset circuit assembly that provides a delay time during reset for enabling other matched electronic devices to have sufficient time to reach ready status. The circuit assembly includes a power source, a first resistor, a first electric control switch, which has a control end and two bypasses being respectively connected to a reset terminal and a grounding terminal, a second resistor, a second electric control switch, which has a control end and two bypasses being respectively connected to the control end of the first electric control switch and the grounding terminal, a third resistor, a first capacitor, a second capacitor, a manual switch, which has two opposite ends respectively connected to the second capacitor and the grounding terminal, and a fourth resistor, which has two opposite ends respectively connected to the power source and the second end of the second capacitor.

9 Claims, 1 Drawing Sheet

HARD RESET AND MANUAL RESET CIRCUIT ASSEMBLY

BACKGROUND OF THE INVENTION

1. Field of the Invention

The present invention relates to a reset circuit and more particularly to a hard reset and manual reset circuit assembly.

2. Description of the Related Art

In a computer system, reset is an important function. In case of system hang up or execution error, reset the system can cause the system to boost again, returning to the normal operation status.

U.S. Pat. No. 5,935,254 discloses a reset circuit entitled "Computer system for cutting off power by key input signals or programming and having a reset switch for resetting and supplying power". This design is capable of providing a signal to cause the system to reset. However, the circuit architecture of this design is complicated. Further, the manufacturing cost of this design is high because it uses a switching mode power supply (SMPS) for providing an operating power and a stand-by voltage to the main computer block, a power-on signal generator for generating a power-on signal to the SMPS.

Further, conventional reset devices do not consider the problem of delay. To certain electronic apparatus, starting all devices simultaneously may cause the problem that some devices start working and some other devices are not ready. In this case, an incorrect signal may exist or be produced, resulting in an accident.

SUMMARY OF THE INVENTION

The present invention has been accomplished under the circumstances in view. It is the main object of the present invention to provide a hard reset and manual reset circuit assembly, which has a simple and low-cost circuit structure, and provides effective reset function.

It is another object of the present invention to provide a hard reset and manual reset circuit assembly, which provides a delay on reset so that the matched external device has sufficient time to enter a ready status.

To achieve these and other objects of the present invention, the hard reset and manual reset circuit assembly comprises a power source; a first resistor, the first resistor having two opposite ends thereof respectively connected to the power source and a reset terminal; a first electric control switch, the first electric control switch comprising a control end and two bypasses, the two bypasses of the first electric control switch being respectively connected to the reset terminal and a grounding terminal; a second resistor, the second resistor having two opposite ends respectively connected to the power source and the control end of the first electric control switch; a second electric control switch, the second electric control switch comprising a control end and two bypasses, the two bypasses of the second electric control switch being respectively connected to the control end of the first electric control switch and the grounding terminal; a third resistor, the third resistor comprising two opposite ends respectively connected to the power source and the control end of the second electric control switch; a first capacitor, the first capacitor comprising two opposite ends respectively connected to the control end of the second electric control switch and the grounding terminal; a second capacitor, the second capacitor comprising a first end and a second end, the first end of the second capacitor being connected to the control end of the second electric control switch; a manual switch, the manual switch comprising two opposite ends respectively connected to the second end of the second capacitor and the grounding terminal; and a fourth resistor, the fourth resistor comprising two opposite ends respectively connected to the power source and the second end of the second capacitor. By means of the aforesaid arrangement, the hard reset and manual reset circuit assembly provides a delay time during reset, for enabling other matched electronic devices to have sufficient time to reach ready status.

DETAILED DESCRIPTION OF THE INVENTION

Figure 1:
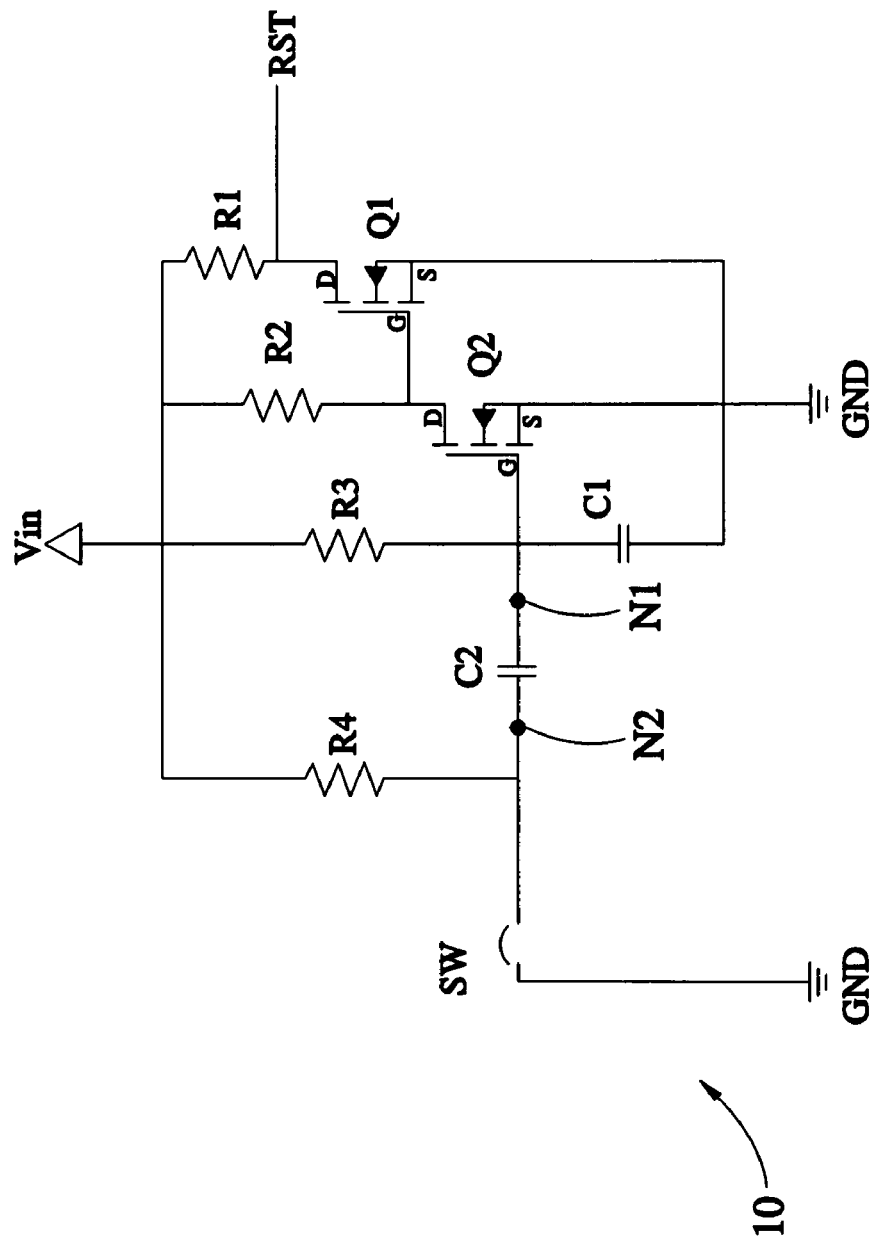
FIG. 1 is a circuit diagram of a hard reset and manual reset circuit assembly in accordance with the present invention.

Referring to FIG. 1 a hard reset and manual reset circuit assembly 10 in accordance with the present invention is shown comprised of a power source Vin, a first resistor R1, a first electric control switch Q1, a second resistor R2, a second electric control switch Q2, a third resistor R3, a first capacitor C1, a second capacitor C2, a manual switch SW, and a fourth resistor R4.

The first resistor R1 has its two opposite ends respectively connected to the power source Vin and a reset terminal RST.

The first electric control switch Q1 is a semiconductor switch, for example, N-channel MOSFET (N-channel metal-oxide semiconductor field-effect transistor), having a control end (the gate G) and two bypasses (the drain D and the source S). The two bypasses (the drain D and the source S) are respectively connected to the reset terminal RST and a grounding terminal GND.

The second resistor R2 has its two opposite ends respectively connected to power source Vin and the control end (the gate G) of the first electric control switch Q1.

The second electric control switch Q2 is a semiconductor switch, for example, N-channel MOSFET (N-channel metal-oxide semiconductor field-effect transistor), having a control end (the gate G) and two bypasses (the drain D and the source S). The two bypasses (the drain D and the source S) of the second electric control switch Q2 are respectively connected to the control end (the gate G) of the first electric control switch Q1 and the aforesaid grounding terminal GND.

The third resistor R3 has its two opposite ends respectively connected to the aforesaid power source Vin and the control end (the gate G) of the second electric control switch Q2.

The first capacitor C1 has its two opposite ends respectively connected to the control end (the gate G) of the second electric control switch Q2 and the aforesaid grounding terminal GND.

The second capacitor C2 has a first end N1 and a second end N2. The first end N1 is connected to the control end (the gate G) of the second electric control switch Q2.

The manual switch SW has its two opposite ends respectively connected to the second end N2 of the second capacitor C2 and the aforesaid grounding terminal GND.

The fourth resistor R4 has its two opposite ends respectively connected to the aforesaid power source Vin and the second end N2 of the second capacitor C2.

The working status of the present invention is described hereinafter:

1. When the manual switch SW is off and the power source Vin is on, the power source Vin charges the first capacitor C1 through the third resistor R3. At this time, the control end of the first electric control switch Q1 is at high potential, and therefore the first electric control switch Q1 is switched on, and the reset terminal RST is at a low-potential activation status. When the first capacitor C1 is charged to high potential, the control end of the second electric control switch Q2 becomes high, and therefore the second electric control switch Q2 is switched on. At this time, the control end of the first electric control switch Q1 is at low potential, and therefore the first electric control switch Q1 is switched off, and the reset terminal RST is turned to a high-potential off status. This operation status explains that when the power source starts to supply power as the system is turned on, the reset terminal will be changed from the low-potential activation status to the high-potential off status after the period of the charging time of the first capacitor, so that the connected external devices will have sufficient time to reach the ready status.

2. When the power source Vin is on and the manual switch SW is switched on, the power source Vin charges the second capacitor C2 through the third resistor R3. At this time, the control end of the first electric control switch Q1 is at high potential, and therefore the first electric control switch Q1 is switched on, and the reset terminal RST is at a low-potential activation status. When the second capacitor C2 is charged to high potential, the control end of the second electric control switch Q2 becomes high, and therefore the second electric control switch Q2 is switched on. At this time, the control end of the first electric control switch Q1 is at low potential, and therefore the first electric control switch Q1 is switched off, and the reset terminal RST is turned to a high-potential off status. This operation status explains the manual switch executes the reset operation.

The aforesaid working status includes the delay reset operation of the power source Vin with the third resistor R3 and the first capacitor C1 and the delay reset operation of the manual switch SW with the power source Vin and the third resistor R3 and the second capacitor C2. As illustrated in FIG. 1, the first capacitor C1 and the second capacitor C2 both are installed in the circuit of the present invention, achieving hard reset function as well as manual reset functions.

As stated above, either the manual switch SW is on or off during supply of the power source Vin, the working status of the present invention causes the reset terminal RST to reset the system. During the resetting process, a delay time is provided subject to the charging time of the first capacitor C1 or second capacitor C2, and therefore the connected external devices have sufficient time to reach the ready status. Further, the component parts used in the hard reset and manual reset circuit assembly of the present invention are cheap, and the circuit design of the present invention is simple, therefore the manufacturing cost of the hard reset and manual reset circuit assembly of the present invention is low.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A hard reset circuit comprising:
a power source;
a first resistor, said first resistor having two opposite ends thereof respectively connected to said power source and a reset terminal;
a first electric control switch, said first electric control switch comprising a control end and two bypasses, the two bypasses of said first electric control switch being respectively connected to said reset terminal and a grounding terminal;
a second resistor, said second resistor having two opposite ends respectively connected to said power source and the control end of said first electric control switch;
a second electric control switch, said second electric control switch comprising a control end and two bypasses, the two bypasses of said second electric control switch being respectively connected to the control end of said first electric control switch and said grounding terminal;
a third resistor, said third resistor comprising two opposite ends respectively connected to said power source and the control end of said second electric control switch; and
a first capacitor, said first capacitor comprising two opposite ends respectively connected to the control end of said second electric control switch and said grounding terminal;
wherein said first electric control switch and said second electric control switch are N-channel metal-oxide semiconductor field-effect transistors.

2. A manual reset circuit comprising:
a power source;
a first resistor, said first resistor having two opposite ends thereof respectively connected to said power source and a reset terminal;
a first electric control switch, said first electric control switch comprising a control end and two bypasses, the two bypasses of said first electric control switch being respectively connected to said reset terminal and a grounding terminal;
a second resistor, said second resistor having two opposite ends respectively connected to said power source and the control end of said first electric control switch;
a second electric control switch, said second electric control switch comprising a control end and two bypasses, the two bypasses of said second electric control switch being respectively connected to the control end of said first electric control switch and said grounding terminal;
a third resistor, said third resistor comprising two opposite ends respectively connected to said power source and the control end of said second electric control switch;
a second capacitor, said second capacitor comprising a first end and a second end, the first end of said second capacitor being connected to the control end of said second electric control switch; and
a manual switch, said manual switch comprising two opposite ends respectively connected to the second end of said second capacitor and said grounding terminal.

3. The manual reset circuit as claimed in claim 2, further comprising a fourth resistor, said fourth resistor comprising two opposite ends respectively connected to said power source and the second end of said second capacitor.

4. The manual reset circuit as claimed in claim 3, wherein said first electric control switch and said second electric control switch are semiconductor switches.

5. The manual reset circuit as claimed in claim 4, wherein said first electric control switch and said second electric control switch are N-channel metal-oxide semiconductor field-effect transistors.

6. A hard reset and manual reset circuit assembly comprising:
a power source;
a first resistor, said first resistor having two opposite ends thereof respectively connected to said power source and a reset terminal;
a first electric control switch, said first electric control switch comprising a control end and two bypasses, the two bypasses of said first electric control switch being respectively connected to said reset terminal and a grounding terminal;
a second resistor, said second resistor having two opposite ends respectively connected to said power source and the control end of said first electric control switch;
a second electric control switch, said second electric control switch comprising a control end and two bypasses, the two bypasses of said second electric control switch being respectively connected to the control end of said first electric control switch and said grounding terminal;

a third resistor, said third resistor comprising two opposite ends respectively connected to said power source and the control end of said second electric control switch;

a first capacitor, said first capacitor comprising two opposite ends respectively connected to the control end of said second electric control switch and said grounding terminal;

a second capacitor, said second capacitor comprising a first end and a second end, the first end of said second capacitor being connected to the control end of said second electric control switch; and a manual switch, said manual switch comprising two opposite ends respectively connected to the second end of said second capacitor and said grounding terminal.

7. The hard reset and manual reset circuit assembly as claimed in claim 6, further comprising a fourth resistor, said fourth resistor comprising two opposite ends respectively connected to said power source and the second end of said second capacitor.

8. The hard reset and manual reset circuit assembly as claimed in claim 7, wherein said first electric control switch and said second electric control switch are semiconductor switches.

9. The hard reset and manual reset circuit assembly as claimed in claim 8, wherein said first electric control switch and said second electric control switch are N-channel metal-oxide semiconductor field-effect transistors.

* * * * *